Aug. 19, 1969 M. E. AKLUFI 3,461,550

METHOD OF FABRICATING SEMICONDUCTOR DEVICES

Filed Sept. 22, 1965

INVENTOR
Monti E. Aklufi
BY
Kenyon & Kenyon
ATTORNEYS

United States Patent Office 3,461,550
Patented Aug. 19, 1969

3,461,550
METHOD OF FABRICATING SEMICONDUCTOR DEVICES
Monti E. Aklufi, 489 1st Ave., New York, N.Y. 10016
Filed Sept. 22, 1965, Ser. No. 489,208
Int. Cl. B01j *17/00;* H01l *5/00*
U.S. Cl. 29—578 6 Claims

ABSTRACT OF THE DISCLOSURE

A process for making semi-conductors and the semi-conductors themselves is disclosed. The process includes forming an adherent, continuous nonconductive layer mask on a formed plane surface of a semi-conductor body of a given conductivity type, placing a thin enough porous etch resisting film over the layer mask to achieve a plurality of randomly placed holes extending through said etch resisting film to said nonconductive layer mask, etching at least one window by said holes through said layer mask to said semi-conductor body and removing said etch resisting film. The process also includes delineating a junction by introducing through at least one window an impurity of opposite conductivity type as said semi-conductor body and providing an ohmic contact through the window and an ohmic contact on the underside of said body.

This invention relates to the improvement in the fabrication of semiconductor devices and to their improved structures. More particularly, this invention relates to a method of producing diffused junction devices with minimum junction areas and maximized junction periphery to junction area ratios.

With the introduction of diffused semiconductor devices, efforts in the field have in part been directed towards decreasing junction areas and increasing junction periphery to junction area ratios. For some devices these changes have led to improvements in frequency response and junction efficiency, as well as to other improved device characteristics that are dependent upon these structural relationships. One device whose characteristics are in part dependent upon the aforementioned relationships is the diffused silicon transistor. It is to this transistor type that the following description is intended, although the present invention is adaptable to other semiconductor devices as well as to multi-element units.

In the fabrication of diffused silicon transistors it is of common practice to use photolithographic techniques to delineate diffused junction structures with shaped silicon oxide layer masks. Although desirable diffused junctions have been formed, image and hence junction structure formation below the resolution capability of the photolithographic system has been unattainable. This in effect has set the upper limit in frequency application insofar as minimum obtainable junction area is concerned.

A further difficulty arises in the design requirements of high frequency, diffused silicon power transistors. Frequency response, as had been noted, is in part affected by the junction area whereas power is affected in part by junction periphery. For some circuit configurations, the need for increased emitter junction periphery to junction area ratios has led to the development of interdigitated and multi-imaged structures. Accordingly, transistors have been successfully fabricated but at their incurred costs. Furthermore, due to the minimum area attainable by photolithographic techniques, large peripheries for power transistors have required large junction areas. These large junction areas have greatly reduced the yield due to the increased probability of finding silicon material defects, mask defects, diffusion irregularities and such in the transistor body. This has proven very difficult if not limiting, in the fabrication of high frequency, diffused silicon power transistors.

Accordingly, one object of the present invention is to provide an improved method for fabricating diffused semiconductor devices.

Another object of the present invention is to provide improved diffused semiconductor devices.

A further object of the present invention is to provide improved diffused semiconductor devices with minimum junction areas.

It is still a further object of the present invention to provide improved diffused semiconductor devices with maximized junction periphery to junction area ratios.

These and other objects of the present invention are accomplished by the utilization of porous etch resisting films in the shaping of adherent, continuous, non-conductive layer masks into suitable windows. It has been found by controlling the thickness of these etch resisting films below 0.001 inch it is possible to control the degree of film porosity and thereby the number and size of holes through which layer mask windows can be formed. Following the formation of these windows, selected impurity diffusions and subsequent placement of ohmic contacts can be performed through said windows.

As previously indicated, although the present invention is adaptable to various other semiconductor devices as well as to multi-element units, the following description has been primary directed towards the diffused transistor. Thus the present invention itself, together with further objects and advantages, will be understood more clearly and fully from the following description with reference to the accompanying drawing in which.

Figure 1:
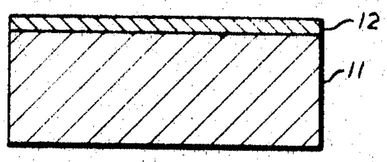
FIGURES 1, 3 and 4 are schematic cross-sectional views illustrating successive steps towards the fabrication of a diffused semiconductor diode device according to one embodiment of the present invention.

As herein described, one embodiment of the present invention, an improved semiconductor diode device is referred to in FIGURES 1 to 5 of the drawing. Referring to FIGURE 1 of the drawing, a wafer 11 is formed of a monocrystalline semiconducting material, for example, N-conductivity type silicon. Upon this wafer 11 there is formed an adherent, continuous, non-conductive layer mask 12. As in this embodiment this layer is silicon dioxide and is formed by methods known in the art.

Figure 2:
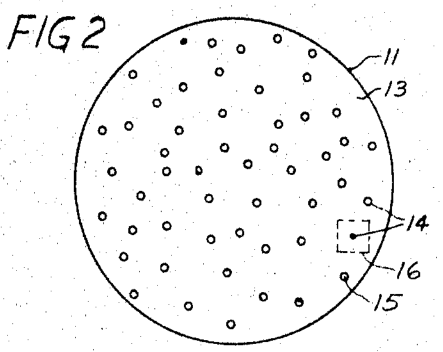
FIGURE 2 is a schematic plan view which includes FIGURE 3 and represents a semiconductor wafer.

Referring to FIGURE 2 of the drawing, in accordance with the present invention a porous etch resisting film 13 is placed on the silicon dioxide layer. By controlling the film thickness below 0.001 inch a plurality of holes 14 are formed in the film that extend to the silicon dioxide surface 15. As in this embodiment, the porous etch resisting film is formed of an organic material such as film-forming polyesters, lacquers, waxes, inks and the like that have the qualities to withstand the etchants that are used to shape said layers into suitable masks. These etchants as in the case of silicon dioxide can be, for example, hydrofluoric acid and its buffered solutions.

The porous etch resisting films may be applied by spraying, dipping, evaporating and spinning with the proper solvent dilution aiding all excepting evaporation in securing a wide latitude in film thickness. Thickness measurements of the applied films can then be measured by non-destructive techniques as interferometry and the like. The proper selection of a film's thickness for a given film system can be readily secured by considering two graphical representations: (1) the number of holes per unit area of film plotted as a function of the film's thickness, and (2) the size of the holes in the film plotted as a function of the film's thickness.

Figure 3:
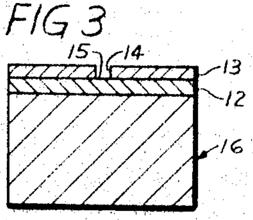

Referring to FIGURE 3 of the drawing, consider a minute wafer section 16 as cut from the larger wafer 11 with a hole 14 extending through the porous etch resisting film 13 to the silicon dioxide surface 15. Utilizing the porous film's etch resisting qualities, the silicon dioxide 15 within said hole 14 can be removed when placed in a silicon dioxide etchant, such as, the buffered hydrofluoric acid solution. The film 13 can then be subsequently removed with a suitable organic solvent as trichloroethylene or the like, or if polymerized, in a strong oxidizing solution as hot sulfuric acid or the like.

Figure 4:
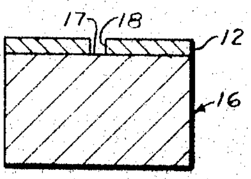

Referring to FIGURE 4 of the drawing, having etched through the hole in the porous etch resisting film and accomplished the removal of said film, there remains the minute wafer section 16 with a window 18 extending through the silicon dioxide layer mask to the upper surface 17 of the silicon wafer 16. Through said window 18 a subsequent diffusion can be readily accomplished by methods well known in the art.

Figure 5:
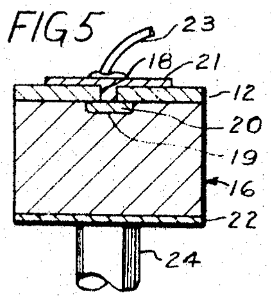
FIGURE 5 is a schematic cross-sectional view of a diffused semiconductor diode device fabricated in accordance with the present invention.

Referring to FIGURE 5 of the drawing, there is illustrated in cross-section an improved semiconductor diode device fabricated in accordance to the present invention. Through window 18 in the silicon dioxide layer mask 12, as shaped by the porous etch resisting film, a P-type impurity is diffused to form the P–N junction 19 and the P-type semiconductor region 20. Providing the ohmic contact 21 through said window 18 and the ohmic contact 22 upon the underside of the wafer, dicing the minute wafer 16 from the larger wafer 11, and completing the electrical contact to wafer 16 with leads 23 and 24 are all readily accomplished by methods well known in the art. It can be appreciated that the size of said window 18, for a given film system, is dependent upon the film's thickness and is not limited by the resolution capabilities of photo-fabricated mask systems.

Figure 6:
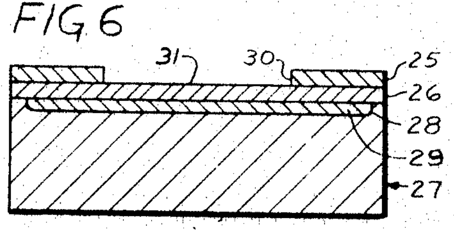
FIGURES 6–8 are schematic cross-sectional views illustrating successive steps towards the fabrication of a diffused transistor according to another embodiment of the present invention.

As herein described, in another embodiment of the present invention an improved diffused silicon transistor is referred to in FIGURES 6 to 10 of the drawing. Referring to FIGURE 6 of the drawing, a minute wafer 27 is formed of a monocrystalline semiconducting material, for example, N-conductivity type silicon. The formation of the P–N base to collector junction 28 with the P-type base region 29, the formation of the silicon dioxide layer 26, and the formation of an etch resist coating 25, with a precise mask delineated hole 30 that extends to the silicon dioxide surface 31, covering a portion of the diffused base region are all readily accomplished by methods well known in the art.

Figure 7:
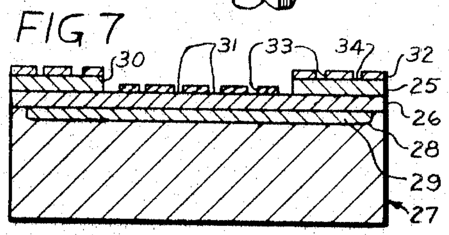

Referring to FIGURE 7 of the drawing, in accordance with the present invention a porous etch resisting film 32 is placed on the masked delineated etch resist coating 25 and the silicon dioxide layer 26. By controlling the film's thickness below 0.001 inch a plurality of holes 33 are formed in the film that extends to the silicon dioxide surface 31 and to the etch resist coating's surface 34. As indicated for FIGURE 2, the proper selection of a film's thickness, for a given film system, can be secured by considering the following graphical representations: (1) the number of holes per unit area of film, and (2) the size of the holes in the film, both plotted as a function of the film's thickness. Utilizing the porous film's etch resisting qualities, the silicon dioxide 26 within said holes 33 can be removed when placed in a silicon dioxide etchant, such as, a buffered hydrofluoric acid solution. It will be appreciated that none of the silicon dioxide layer that exists beneath both the etch resist coating and the porous etch resisting film is removed due to the etch resist coating barrier. This can then allow the removal of the silicon dioxide from preselected sites only thus leaving other areas, as portions of the base and collector, unetched; film 32 can then be removed.

Figure 8:
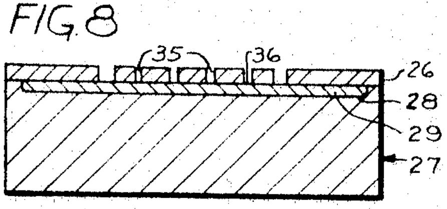

Referring to FIGURE 8 of the drawing, having etched through the holes in the porous etch resisting film and accomplished the removal of said film, there remains the minute wafer 27 with windows 35 extending through the silicon dioxide layer mast to the upper surface 36 of the silicon wafer 27. It should be noted that only in the preselected portion of the base surface have windows been formed.

Figure 9:
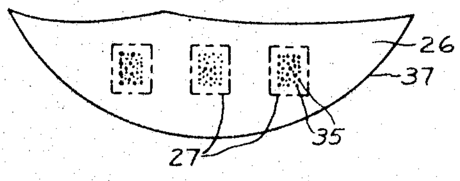
FIGURE 9 is a schematic plan view which includes FIGURE 8 and represents a portion of a semiconductor wafer.

Referring to FIGURE 9 of the drawing, a portion of a semiconductor wafer 37 contains three minute wafers 27. Having etched through the holes in the porous etch resisting film and accomplished the removal of said film, there remains the windows 35 through the silicon dioxide layer mask 26 extending to the upper surface of the minute silicon wafer 27. Through said windows 35 a subsequent emitter diffusion can be readily accomplished by methods well known in the art, resulting in a plurality of emitter regions. When the plurality of emitter junctions are formed, there is provided a materially improved transistor structure where the emitter junction periphery to junction area is greatly increased. It should be noted that due to the nature of the diffusion process, spacing of the emitter windows should not be less than the depth of the emitter diffusion, otherwise loss of the individual minute emitters results.

Figure 10:
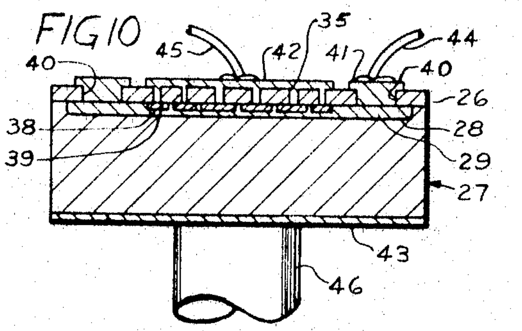
FIGURE 10 is a schematic cross-sectional view of a diffused transistor fabricated in accordance with the present invention.

Referring to FIGURE 10 of the drawing, there is illustrated in cross-section an improved diffused silicon transistor fabricated in accordance to the present invention. Through windows 35 in the silicon dioxide layer mask 26, as shaped by the porous etch resisting film, a N-type impurity is diffused to form the plurality of emitter to base junctions 38 and emitter regions 39. A base opening 40, which surrounds the described emitter regions, the placement of base ohmic contact 41, the placement of ohmic contact 42 through emitter windows 35, and the placement of collector ohmic contact 43 are all readily accomplished by methods known in the art. Electrical leads 44, 45, 46 are subsequently attached to the respective base 41, emitter 42 and collector 43 ohmic contacts.

It should be noted that the adherent, continuous, non-conductive layer is to be sufficiently non-reactive so as to act as a mask during impurity diffusion and the subsequent placement of electrical contacts. The silicon dioxide layer 26, as described in the foregoing embodiment is therefore limited insofar as the group 3 element gallium is concerned.

Other modifications may be made within the scope and spirit of the present invention. For example, the porous etch resisting film may be formed with vacuum evaporated metals, as selenium or nickel, upon the adherent, continious, nonconductive layer mask. After etching suitable windows, these films of selenium and nickel may then be removed by evaporation and hot concentrated nitric acid respectively.

This present invention is not limited to the described embodiments, other variations and modifications can be made without departing from my invention in its broader aspects. It is to be understood that I aim therefore in the appended claims to cover all such changes and modifications as fall within the true scope of my invention.

What I claim as new and desire to secure by Letters Patent of the United States is:

1. A method of fabricating a semi-conductor device comprising the steps of:
   (a) forming a non-conductive layer of mask material on a surface of a semi-conductor body,
   (b) placing a film of etch resisting material having a predetermined thickness less than .001 inch over the non-conductive layer of mask material, the film being applied in such manner as to provide a porous layer having minute pores extending through the film to the layer of mask material, the number and size of minute through-holes thus formed being determined by the predetermined thickness of the film,
   (c) etching through at least one hole of the film to form a window extending through the layer of mask material to the surface of the semi-conductor body, and
   (d) removing the film from the layer of mask material.

2. A method of fabricating a semi-conductor device comprising the steps of:
   (a) forming a layer of non-conductive mask material on a surface of a semi-conductor body of a given conductivity type,
   (b) placing a film of etch resisting material having a predetermined thickness less than .001 inch over the non-conductive layer of mask material, the film being applied in such manner as to provide a porous layer having minute pores extending through the film to the layer of mask material, the number and size of minute through-holes thus formed being determined by the predetermined thickness of the film,
   (c) etching through at least one hole of the film to form a window extending through the layer of mask material to the surface of the semi-conductor body,
   (d) removing the film from the layer of mask material, and
   (e) introducing an impurity of opposite conductivity type as the semi-conductor body through each window.

3. A method of fabricating a semi-conductor device comprising the steps of:
   (a) forming a non-conductive layer of mask material on a surface of the semiconductor body,
   (b) placing a film of etch resisting material having a predetermined thickness less than .001 inch over the non-conductive layer of mask material, the film being applied in such manner as to provide a porous layer having minute pores extending through the film to the layer of mask material, the number and size of minute through-holes thus formed being determined by the predetermined thickness of the film,
   (c) etching a plurality of holes through the film to form windows extending through the layer of mask material to the surface of the semi-conductor body,
   (d) removing the film from the layer of mask material, (e) introducing an impurity of opposite conductivity as the semi-conductor body through each window to the semi-conductor body, and
   (f) cutting a portion containing at least one window with an impurity in it from the semi-conductor body.

4. A method of making a transistor comprising the steps of:
   (a) forming a junction in a body of semiconductor material of a first conductivity type and a region therein of a second conductivity type.
   (b) placing a nonconducting layer mask over the region,
   (c) placing a film of etch resisting material having a predetermined thickness less than .001 inch over the non-conductive layer of mask material, the film being applied in such manner as to provide a porous layer having minute pores extending through the film to the layer of mask material, the number and size of minute through-holes thus formed being determined by the predetermined thickness of the film,
   (d) etching through the holes to form a window extending through the nonconductive layer mask to the region,
   (e) removing said etch resisting film,
   (f) introducing an impurity of the first conductivity type through the windows,
   (g) attaching an ohmic contact to the material of the second conductivity type,
   (h) attaching an ohmic contact through the windows, and
   (i) attaching an ohmic contact to the semi-conductor body.

5. A method of making a semi-conductor device comprising the steps of:
   (a) placing a non-conductive layer of mask material over a semi-conductor body,
   (b) placing a film of etch resisting material having a tions of the layer of mask material for isolating the selected portion of the layer of masked material from subsequent steps of the method,
   (c) placing a film of etch resisting material having a predetermined thickness less than .001 inch over the nonconductive layer of mask material, the film being applied in such manner as to provide a porous layer having minute pores extending through the film to the layer of mask material, the number and size of minute through-holes thus formed being determined by the predetermined thickness of the film,
   (d) etching through at least one hole of the film to the layer of mask material to form a window extending to the semi-conductor body, and
   (e) removing the etch resisting film and etch resisting coating.

6. A method of making a transistor including the steps of forming a junction including a body of semi-conductor material of a first conductivity type and a region in the middle portion thereof of a second conductivity type so that the body of the first conductivity type surrounds the region, placing a nonconducting layer of mask material extending over the region of the second conductivity type and the body of the first conductivity type, the improvement comprising:
   (a) placing an etch resisting coating over selected portions of the layer of mask material so as to leave a portion of the layer of mask material over the region uncoated for isolating the selected portion of the layer of mask material from subsequent steps of the method,
   (b) placing a film of etch resisting material having a predetermined thickness less than .001 inch over the nonconductive layer of mask material, the film being applied in such manner as to provide a porous layer having minute pores extending through the film to the layer of mask material, the number and size of minute through-holes thus formed being determined by the predetermined thickness of the film, (c) etching through the holes to form windows extending through the nonconducting layer of mask material to the region, (d) introducing an impurity of the first conductivity type through the windows, (e) attaching an ohmic contact to the material of the second conductivity type, (f) attaching an ohmic contact through the window and (g) attaching an ohmic contact to the semi-conductor body.

References Cited

UNITED STATES PATENTS

| | | | |
|---|---|---|---|
| 2,981,877 | 4/1961 | Noyce. | |
| 3,025,589 | 3/1962 | Hoerni | 29—578 |
| 3,184,329 | 5/1965 | Burns. | |
| 3,193,418 | 7/1965 | Cooper et al. | |

JOHN F. CAMPBELL, Primary Examiner

W. I. BROOKS, Assistant Examiner

U.S. Cl. X.R.

29—580, 589

UNITED STATES PATENT OFFICE

CERTIFICATE OF CORRECTION

Patent No. 3,461,550 August 19, 19(

Monti E. Aklufi

It is certified that error appears in the above identified patent and that said Letters Patent are hereby corrected as shown below:

Column 2, line 29, "of adherent" should read -- of an adherent --. Column 6, lines 37 to 40 should read -- (b) placing an etch resisting coating over selected portions of the layer of mask material for isolating the selected portion of the layer of masked material from subsequent steps of the method, --.

Signed and sealed this 5th day of May 1970.

(SEAL)

Attest:

Edward M. Fletcher, Jr.

Attesting Officer

WILLIAM E. SCHUYLER, JR.

Commissioner of Patents